(12) United States Patent
Zhang

(10) Patent No.: US 10,356,920 B2
(45) Date of Patent: Jul. 16, 2019

(54) FLEXIBLE ELECTRONIC DEVICE AND BENDABLE APPARATUS THEREOF

(71) Applicant: Lenovo (Beijing) Co., Ltd., Beijing (CN)

(72) Inventor: Ran Zhang, Beijing (CN)

(73) Assignee: LENOVO (BEIJING) CO., LTD., Beijing (CN)

( * ) Notice: Subject to any disclaimer, the term of this patent is extended or adjusted under 35 U.S.C. 154(b) by 0 days.

(21) Appl. No.: 15/593,917

(22) Filed: May 12, 2017

(65) Prior Publication Data
US 2017/0332497 A1 Nov. 16, 2017

(30) Foreign Application Priority Data

May 12, 2016 (CN) .................... 2016 2 0429210 U

(51) Int. Cl.
| | |
|---|---|
| *H05K 5/00* | (2006.01) |
| *H01L 51/52* | (2006.01) |
| *H05K 5/02* | (2006.01) |
| *G09F 9/30* | (2006.01) |
| *H01L 51/00* | (2006.01) |
| *H04M 1/02* | (2006.01) |
| *G06F 1/16* | (2006.01) |

(52) U.S. Cl.
CPC ......... *H05K 5/0017* (2013.01); *G06F 1/1613* (2013.01); *G09F 9/301* (2013.01); *H01L 51/0097* (2013.01); *H01L 51/5237* (2013.01); *H04M 1/0206* (2013.01); *H04M 1/0266* (2013.01); *H04M 1/0268* (2013.01); *H05K 5/0217* (2013.01); *H01L 2251/5338* (2013.01); *Y02E 10/549* (2013.01)

(58) Field of Classification Search
CPC ...... G06F 1/1652; G06F 1/1681; G06F 1/163; G06F 1/1616; G06F 2203/04102; H01L 2251/5338; H01L 51/5237; H05K 5/0017; H05K 5/0217
See application file for complete search history.

(56) References Cited

U.S. PATENT DOCUMENTS

| | | | |
|---|---|---|---|
| D788,734 S * | 6/2017 | Park ..................... | D14/138 AB |
| 2015/0043174 A1* | 2/2015 | Han ..................... | G02F 1/13452 361/749 |
| 2016/0239046 A1* | 8/2016 | Park ..................... | G06F 1/163 |

* cited by examiner

*Primary Examiner* — James Wu
(74) *Attorney, Agent, or Firm* — Anova Law Group, PLLC

(57) ABSTRACT

A bendable apparatus includes a bendable front member and a bendable back member. The back member includes a connection portion and a support portion. The connection portion has a higher degree of deformability relative to the support portion. Side edges of the back member are attached to side edges of the front member to form an electronic component holding chamber. In response to a bending force being exerted on the apparatus, the connection portion is deformed by the support portion and at least a portion of the connection portion is forced to outside the electronic component holding chamber.

17 Claims, 3 Drawing Sheets

FLEXIBLE ELECTRONIC DEVICE AND BENDABLE APPARATUS THEREOF

CROSS-REFERENCE TO RELATED APPLICATIONS

This application claims priority of Chinese Patent Application No. 201620429210.7, filed on May 12, 2016, the entire contents of which are hereby incorporated by reference.

FIELD OF THE INVENTION

The present disclosure generally relates to the field of mechanical engineering and, more particularly, relates to a flexible electronic device and a bendable apparatus thereof.

BACKGROUND

With the development of the society, flexible electronic devices are applied more and more widely in people's daily work and life. A flexible electronic device often includes a flexible display and a bendable apparatus that supports the flexible display. However, the bendable apparatus in existing flexible electronic devices only functions to support the flexible display, and each electronic component of the flexible electronic device needs to be disposed in a mounting block that is coupled to the bendable apparatus. Because the mounting block is often hard to be deformed, the flexible electronic device can hardly form a smooth arc-shaped structure, which fails to meet users' demand regarding the appearance of the flexible electronic device.

As such, how to dispose electronic components of the flexible electronic device in a deformable holding chamber and ensure that the flexible electronic device forms a smooth appearance and structure have become technical issues to be solved in the related field.

The disclosed flexible electronic device and bendable apparatus thereof are directed to solving at least partial problems set forth above and other problems.

BRIEF SUMMARY OF THE DISCLOSURE

One aspect of the present disclosure provides a bendable apparatus. The bendable apparatus comprises a bendable front member, and a bendable back member including a connection portion and a support portion. The connection portion has a higher degree of deformability relative to the support portion. Side edges of the back member are attached to side edges of the front member to form an electronic component holding chamber. In response to a bending force being exerted on the apparatus, the connection portion is deformed by the support portion and at least a portion of the connection portion is forced to outside the electronic component holding chamber.

Another aspect of the present disclosure provides a flexible electronic device comprising a flexible display and a bendable apparatus coupled to the flexible display. The bendable apparatus comprises a bendable front member, and a bendable back member including a connection portion and a support portion. The connection portion has a higher degree of deformability relative to the support portion. Side edges of the hack member are attached to side edges of the front member to form an electronic component holding chamber. In response to a bending force being exerted on the apparatus, the connection portion is deformed by the support portion and at least a portion of the connection portion is forced to outside the electronic component holding chamber.

Other aspects of the present disclosure can be understood by those skillet in the art in light of the description, the claims, and the drawings of the present disclosure.

BRIEF DESCRIPTION OF THE DRAWINGS

In order to more clearly illustrate technical solutions in disclosed embodiments of the present invention, drawings necessary for the description of the embodiments or the prior art are briefly introduced below. Obviously, the drawings described below are only some embodiments of the present disclosure, and it is possible for those ordinarily skilled in the art to derive other drawings from these drawings without creative effort.

DETAILED DESCRIPTION

The technical solutions in the embodiments of the present disclosure will be described as follows with reference to the accompanying drawings. Obviously, the embodiments described below are merely a part of, rather than entire, embodiments of the present invention. On the basis of the disclosed embodiments, other embodiments obtainable by those ordinarily skilled in the art without creative effort shall fall within the scope of the present invention.

The present disclosure provides an improved bendable apparatus and a flexible electronic device including the bendable apparatus. According to the present disclosure, the bendable, apparatus is not only able to switch between a flat state and a bent state, but may further form a deformable electronic component holding chamber. Accordingly, a smooth bending structure may be formed in a position of the flexible electronic device corresponding to the electronic component holding chamber, thereby satisfying the user demand regarding the appearance of the flexible electronic device.

Figure 4:
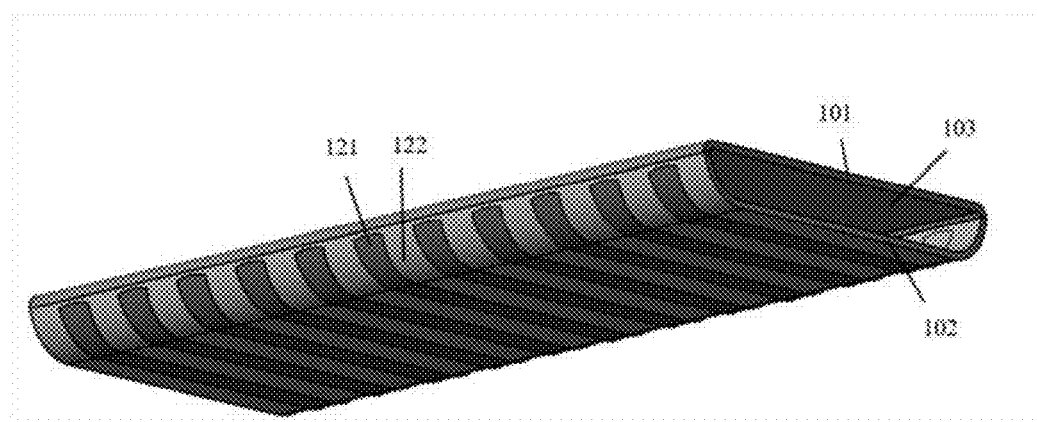
FIG. 4 illustrates a perspective view of an exemplary bendable apparatus in a flat state consistent with disclosed embodiments.
Figure 5:
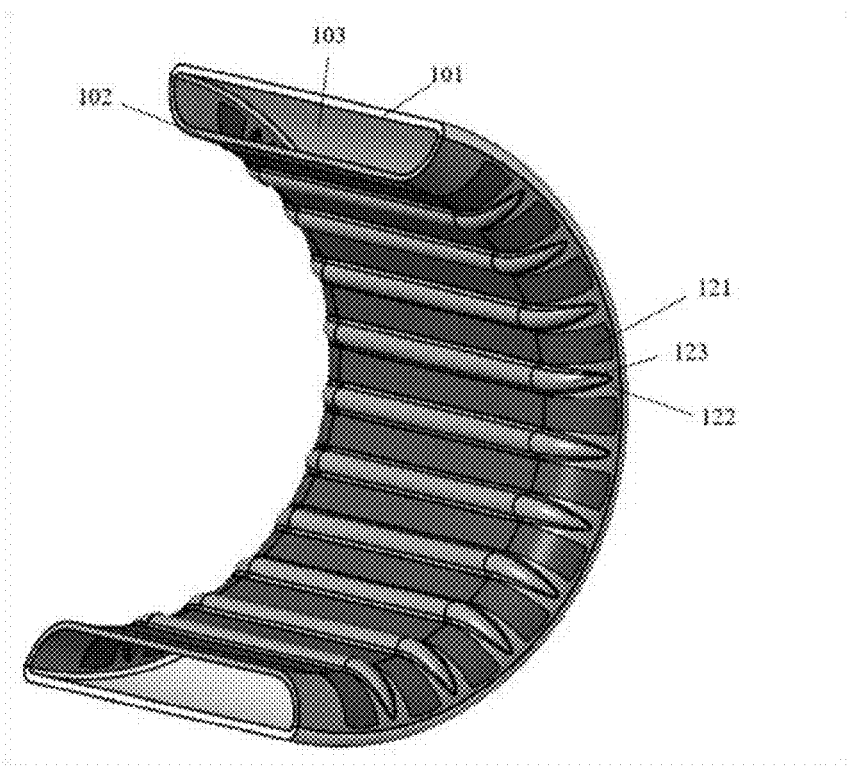
FIG. 5 illustrates a perspective view of an exemplary bendable apparatus in a bent state consistent with disclosed embodiments.

FIG. 4 illustrates a perspective view of an exemplary bendable apparatus in a flat state consistent with disclosed embodiments. FIG. 5 illustrates a perspective view of an exemplary bendable apparatus in a bent state consistent with disclosed embodiments. As shown in FIG. 4 and FIG. 5, the bendable apparatus may have a flat state and a bent state, and may include a front member 101 and a back member 102. The back member 102 may be attached to the front member 101 to form an electronic component holding chamber 103.

More specifically, the front member 101 and the back member 102 may be both bendable members. The back member 102 may comprise a connection portion and a support portion. The support portion may further comprise a plurality of support portion members 121 (also referred to as rigid members), and a plurality of connection portion members 122 (also referred to as deformable members). Further, the connection portion may have a higher degree of deformability relative to the support portion. That is, the plurality of support portion members 121 may have a smaller deformability than the plurality of connection portion members 122.

More specifically, side edges of the back member 102 may be attached to side edges of the front member 101 to form the electronic component holding chamber 103. Additionally, the plurality of connection portion members 122 may relate to deformable members which are spaced apart along a length of the back member 102. Therefore, the plurality of connection portion members 122 are deformed responsive to a bending force being exerted on the bendable apparatus, thereby causing at least a portion of the connection portion members 122 to be forced out of the electronic component holding chamber. Further, the rationale in providing the aforesaid structure of the bendable apparatus, and in particular the support portion members 121, is for ensuring that an internal volume of the electronic component holding chamber remains generally consistent regardless of whether the bendable apparatus is in the flat or bent state. Advantageously, embodiments of the bendable apparatus may minimize any damage to an electronic component that is disposed within the electronic component holding chamber as a result of a reduction in the internal volume of the electronic component holding chamber due to a bending force being exerted thereto.

Further, the front member 101 may be substantially flat in a flat state and may be curved or bent in a bent state. In one embodiment, the front member 101 may be a flexible substrate for mounting a display panel (e.g., a flexible display) or other surface components. Optionally, the front member 101 may be a flexible display panel based on organic light diode display (OLED) or other display technologies. The back member 102 may be deformable and support the front panel 101 in bending actions. In one embodiment, the plurality of support portion members 121 and the plurality of connection portion members 122 included in the deformable portion of the back member 102 may be arranged alternately, and each connection portion member 122 may be fixedly connected to an adjacent support portion member 121.

Figure 2:
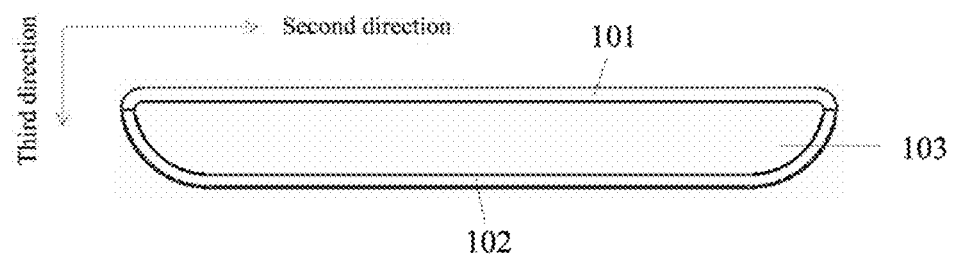
FIG. 2 illustrates a side-view of an exemplary bendable apparatus consistent with disclosed embodiments.

Further, the electronic component holding chamber 103 may have two opened ends. That is, the electronic component holding chamber 103 may not be a closed chamber. FIG. 2 illustrates a side-view of an exemplary bendable apparatus showing one of the two opened ends consistent with disclosed embodiments. As shown in FIG. 2, two side edges of the back member 102 arranged along a second direction may be bent towards the front member 101 into a suitable shape (e.g., a curved shape), and may be fixedly attached to corresponding side edges of the front member 101. The space enclosed by the front member 101 and the back member 102 may be thus the electronic component holding chamber 103. The electronic component holding chamber 103 may accommodate internal electronic components, such as batteries, microprocessors, and display circuitry, etc.

Figure 1:
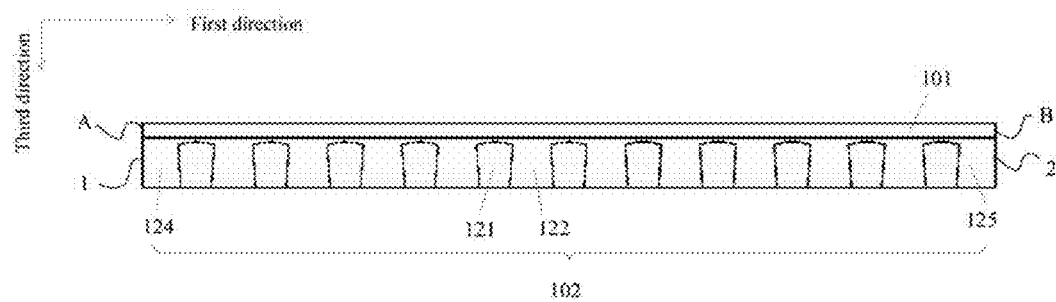
FIG. 1 illustrates a front view of an exemplary bendable apparatus in a flat state consistent with disclosed embodiments.
Figure 3:
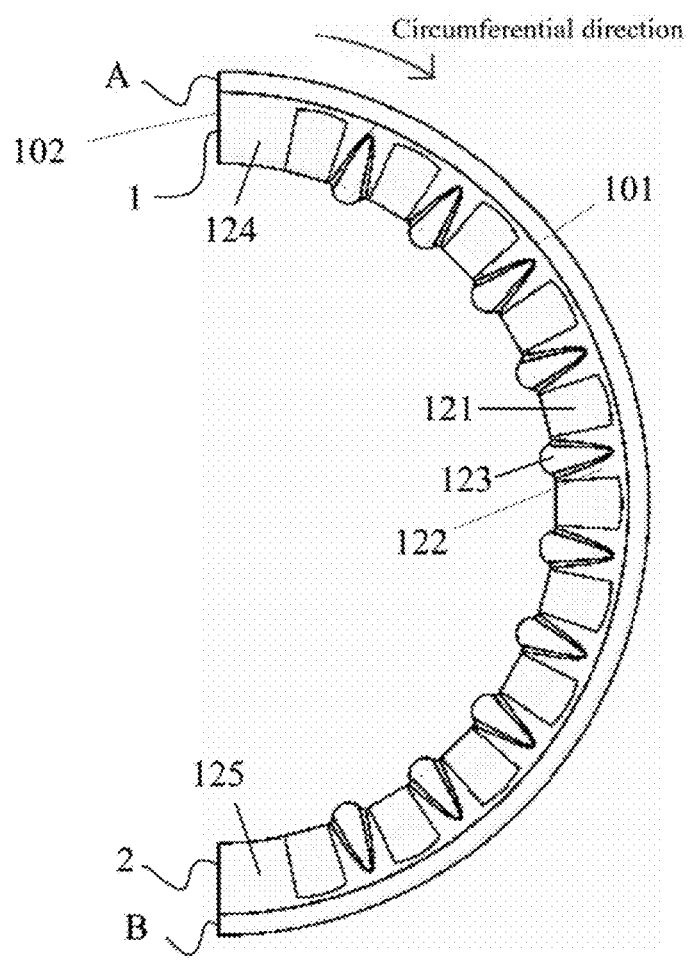
FIG. 3 illustrates a front view of an exemplary bendable apparatus in a bent state consistent with disclosed embodiments.

FIG. 1 illustrates a front view of an exemplary bendable apparatus in a flat state consistent with disclosed embodiments. FIG. 3 illustrates a front view of an exemplary bendable apparatus in a bent state consistent with disclosed embodiments. As shown in FIG. 1 and FIG. 3, the bendable apparatus may have a flat state and a bent state, and may include a front member 101 and a back member 102. The front member 101 may be bendable, and include a first end A and a second end B. The front member 101 may further be fixedly attached to the back member 102 to form an electronic component holding chamber 103 (shown in FIG. 2).

Further, the back member 102 may include a deformable portion and two end portions 124 and 125. The deformable portion may further include a support portion comprising a plurality of support portion members 121 (also referred to as rigid members), and a connection portion comprising a plurality of connection portion members 122 (also referred to as deformable members). For example, the back member 102 may include eleven support portion members 121 and ten connection portion members 122, and the present disclosure is not limited thereto. Further, the end portion 124 may correspond to a first end 1 of the back member 102, and the end portion 125 may correspond to a second end 2 of the back member 102. Optionally, the end portions 124 and 124 may be both connection portion members 122.

Optionally, the first end 1 of the back member 102 may be coincided with the first end A of the front member 101, and the second end 2 of the back member 102 may be coincided with the second end B of the front member 101. Optionally, the end portions 124 and 125 may be fixedly connected to support portion members 121 or connection portion members 122. For example, the end portions 124 and 125 may be each fixedly connected to, an adjacent support portion member 121.

Further, the plurality of support portion members 121 and the plurality of connection portion members 122 may be arranged along a first direction. When the bendable apparatus is in the flat state (i.e., the bending degree of the front member 101 may be considered zero), the first direction refers to a straight direction from the first end 1 to the second end 2 (FIG. 1), and when the bendable apparatus is in the bent state, the first direction refers to a circumferential direction (FIG. 3) corresponding to the bending degree of the front member 101.

Along the first direction, the length of the front member 101 may remain the same no matter whether the bendable apparatus is in the flat state or the bent state. That is, when the bendable apparatus switches from the flat state to the bent state or switches from the bent state to the flat state, the length of the front member 101 may remain unchanged. The length of the front member 101 may refer to, when the bendable apparatus is in the flat state, a straight line distance (FIG. 1) from the first end 1 to the second end 2. When the bendable apparatus is in the bent state, the length of the front member 101 may refer to a curvilinear distance (FIG. 3) from the first end 1 to the second end 2 along the circumferential direction.

Further, along the first direction, the length of the back member 102 in the flat state may be different from the length of the back member 102 in the bent state. More specifically, when the bendable apparatus switches from the flat state to the bent state, the length of the back member 102 along the first direction decreases gradually. When the bendable apparatus switches from the bent state to the flat state, the length of the back member 102 along the first direction increases gradually. That is, the length of the back member 102 along the first direction may vary, thereby allowing the bendable apparatus to switch between the flat state and the bent state.

Similarly, the length of the back member 102 may refer to, when the bendable to apparatus is in the flat state, a straight line distance (FIG. 1) from the first end A to the second end B. When the bendable apparatus is in the bent state, the length of the front member 101 may refer to a curvilinear distance (FIG. 3) from the first end A to the second end B along the circumferential direction. Further, when the bendable apparatus is in the bent state, the back member 102 may be located on an inner side of the bendable apparatus, and the front member 101 may be located on an external side of the bendable apparatus.

Because the electronic component holding chamber 103 is formed by the front member 101 and the back member 102, a smooth bending structure may be formed in a position of a flexible electronic device corresponding to the electronic component holding chamber 103. Accordingly, the user demand regarding the appearance of the flexible electronic device may be satisfied. Further, because the length of the front member 101 along the first direction remains substantially unchained when the bendable apparatus switches between the flat state and the bent state, damages to a component (e.g., a flexible display) or other surface components (e.g., buttons) mounted on the front member 101 may be avoided. Further, the space inside the electronic component holding chamber 103 may also remain substantially unchanged, such that the damages to internal electronic components (e.g., batteries, microprocessors, etc.) may be avoided.

Further, the variance in the length of the back member 102 is realized because of the deformable portion included in the back member 102. The deformable portion may be located in the heading position of the bendable apparatus, and the structure of the deformation portion may be more clearly observed when the bendable apparatus is in the bent state. Further, the support portion and the connection portion included in the deformable portion may have different deformability. That is, the plurality of support portion members 121 may have a smaller deformability than the plurality of connection portion members 122.

In the disclosed bendable apparatus, because the deformable portion includes a support portion and a connection portion having different deformability, on one hand, the connection portion may ensure that the length of the back member 102 varies along the first direction, such that the bendable apparatus may switch between the flat state and the bent state. On the other hand, the support portion may ensure that the electronic component holding chamber 103 maintains a preset space, such that the electronic components inside the electronic component holding chamber 103 may not be damaged by an undesired force exerted on the bendable apparatus.

In one embodiment, the plurality of support portion members 121 and the plurality of connection portion members 122 may be arranged alternately. When the bendable apparatus switches from the flat state to the bent state, any two adjacent support portion members 121 may squeeze the connection portion member 122 disposed between the two adjacent support portion members 121. Accordingly, each connection portion, member 122 disposed between two adjacent support portion members 121 may protrude outwards gradually from the electronic, component holding chamber 103 to form a fold 123. That is, a plurality of folds 123 may be formed when the bendable apparatus switches from the flat state to the bent state.

When the bendable apparatus switches between the flat state and the bent state, because the plurality of connection portion members 122 does not protrude into the electronic component holding chamber 103, the electronic components disposed inside the electronic component holding chamber 103 may not be squeezed by the plurality of connection portion members 122. Thus, the reliability of a flexible electronic device applying the bendable apparatus may be improved.

Optionally, the sizes or dimensions of the plurality of connection portion members 122 may be the same, and the sizes or dimensions of the plurality of support portion members 121 may also be the same. Accordingly, when the bendable apparatus is in the bent state, the plurality of folds 123 formed by the plurality of connection portion members 122 may be distributed uniformly in the back member 102 along the first direction (i.e., the circumferential direction). Accordingly, the appearance and structure of the back member 102 may be ensured to be relatively regular and uniform, thereby meeting the requirements of the users.

Further, in one embodiment, if the appearance and structure of the back member 102 need to be more regular, an axis (not shown) may be applied for coupling the bendable apparatus to a flexible electronic device. For example, the axis may include a plurality of sequentially connected rotary joints, and the rotary joints may be arranged along the first direction. Further, when the bendable apparatus switches between the flat state and the bent state, each rotary joint included in the axis may rotate simultaneously, such that an arc-shaped structure may be formed in the bending position of the bendable apparatus. Accordingly, each connection portion member 122 in the bendable apparatus may be simultaneously squeezed by corresponding support portion members 121 to form a fold 123, thus satisfying the user' demand regarding the appearance of the bendable apparatus.

Optionally, in the aforementioned bendable apparatus, the support portion may be rigid, and for example, the support portion may be made of metal. That is, the plurality of support portion members 121 may be metal support portion members. For example, the plurality of support portion members 121 may be sheet steel support portions. Optionally, the connection portion may be made of rubber. That is, the plurality of connection portion members 122 may be to rubber connection portion members. Further, the support portion and the connection portion may be fabricated or combined integrally via a nano-molding process along a specific direction (e.g., a third direction shown in FIG. 1 or FIG. 2). Thus, the back member 102 may have a smooth and integral appearance.

In one embodiment, to make it more convenient for the users to watch and use a flexible display supported by the bendable apparatus, the front member 101 may be designed into a planar structure with a shape of rectangular, circular, oval, etc. when the bendable apparatus is in the flat state.

Figure 6:
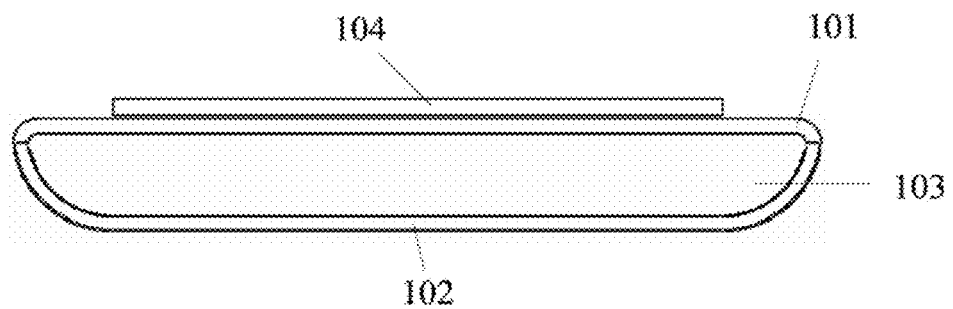
FIG. 6 illustrates a cross-sectional view of an exemplary flexible display device consistent with disclosed embodiments.

The present disclosure also provides a flexible electronic device. FIG. 6 illustrates a cross-sectional view of an exemplary flexible display device consistent with disclosed embodiments. As shown in FIG. 6, the flexible electronic device may include a flexible display 104 and a bendable apparatus. The bendable apparatus may be any aforementioned bendable apparatus, and may include a front member 101 and a back member 102. The front member 101 may be attached to the back member 102 to form an electronic component holding chamber 103.

Further, the flexible display 104 may be disposed on the front member 101 of the bendable apparatus. That is, the flexible display 104 may be located outside of the electronic component holding chamber 103. Further, electronic components of the flexible electronic device may be accommodated in the electronic component holding chamber 103 of the bendable apparatus.

Optionally, the flexible display 104 may be fabricated integrally with the front member 101. Optionally, the front member 101 may be omitted, that is, instead of the front member 101, the flexible display 104 may be attached to the back member 102 to form the electronic component holding chamber 103.

Optionally, the flexible display 104 may be a flexible display panel based on organic light diode display (OLED) or other display technologies. Optionally, the flexible electronic device may be, for example, a wristwatch, bracelet, pendant, or other wearable or miniature devices.

The flexible electronic device provided by embodiments of the present disclosure adopts the bendable apparatus disclosed above, and a smooth bending structure may thus be formed in a position of the flexible electronic device corresponding to the electronic component holding chamber 103, thus satisfying the user demand regarding the appearance of the flexible electronic device. Further, the disclosed flexible electronic device may also have other related effects of the disclosed bendable apparatus, which are not repeated here.

Various embodiments of the present specification are described in a progressive manner, each embodiment may have its difference from other embodiments, and features of different embodiments may be combined together in any appropriate manner or may be separated from each other.

The above specification that discloses various embodiments in intended for those skilled in the art to practice or use this invention. Various modifications of these embodiments are apparent to those skilled in the art, and the basic principles defined in this paper can be realized in other embodiments without departing, from the spirit or scope of this invention. As such, this invention will not be limited to the disclosed embodiments, but rather it is intended to satisfy the widest range that is consistent with the principles and novel ideas made common by this invention.

What is claimed is:

1. An apparatus, comprising:
a bendable front member; and
a bendable back member including a connection portion and a support portion, the connection portion having a higher degree of deformability relative to the support portion,
wherein:
the connection portion of the back member continues along a length direction of the back member and constitutes side edges of the back member, and each of the side edges of the back member constituted by the connection portion is attached to a corresponding one of side edges of the front member to form an electronic component holding chamber,
the support portion of the back member includes a plurality of members that are spaced apart along the length direction of the back member and arranged within the connection portion, and each of the plurality of members is enclosed by the connection portion, and
in response to a bending force being exerted on the apparatus, the connection portion is deformed by the support portion and at least a portion of the connection portion is forced to outside the electronic component holding chamber.

2. The apparatus according to claim 1, wherein:
a length of the front member remains substantially unchanged and a length of the back member varies responsive to the bending force being exerted on the apparatus.

3. The apparatus according to claim 2, wherein:
the support portion is rigid.

4. The apparatus according to claim 3, wherein:
the connection portion comprises a plurality of deformable members that are evenly spaced apart, and the plurality of deformable members and the plurality of members are alternately arranged along the length direction of the back member.

5. The apparatus according to claim 4, wherein:
each deformable member is urged by the support portion to form a fold protruding outwards gradually from the electronic component holding chamber responsive to the bending force being exerted on the apparatus.

6. The apparatus according to claim 5, wherein:
dimensions of the plurality of deformable members are the same.

7. The apparatus according to claim 3, wherein:
the support portion is made of metal;
the connection portion is made of rubber; and
the support portion and the connection portion are combined integrally by a nano-molding process.

8. The apparatus according to claim 1, wherein:
the side edges of the back member are bent towards the front member and fixedly attached to the side edges of the front member.

9. The apparatus according to claim 1, wherein:
the front member is a planar structure responsive to an absence of external force being exerted to the front member.

10. A flexible electronic device comprising:
a flexible display; and
a bendable apparatus coupled to the flexible display, the bendable apparatus including:
a bendable front member; and
a bendable back member including a connection portion and a support portion, the connection portion having a higher degree of deformability relative to the support portion,
wherein:
the connection portion of the back member continues along a length direction of the back member and constitutes side edges of the back member, and each of the side edges of the back member constituted by the connection portion is attached to a corresponding one of side edges of the front member to form an electronic component holding chamber,
the support portion of the back member includes a plurality of members that are spaced apart along the length direction of the back member and arranged within the connection portion, and each of the plurality of members is enclosed by the connection portion, and
in response to a bending force being exerted on the bendable apparatus, the connection portion is deformed by the support portion and at least a portion of the connection portion is forced to outside the electronic component holding chamber.

11. The flexible electronic device according to claim 10, wherein:
a length of the front member remains substantially unchanged and a length of the back member varies responsive to the force being exerted on the bendable apparatus.

12. The flexible electronic device according to claim 11, wherein:
the support portion of the bendable apparatus is rigid.

13. The flexible electronic device according to claim 12, wherein:
the connection portion comprises a plurality of deformable members that are evenly spaced apart, and the plurality of deformable members and the plurality of members are alternately arranged along the length direction of the back member of the bendable apparatus.

14. The flexible electronic device according to claim 13, wherein:
each deformable member is urged by the support portion of the bendable apparatus to form a fold protruding outwards gradually from the electronic component holding chamber responsive to the force being exerted on the bendable apparatus.

15. The flexible electronic device according to claim 10, wherein:
the flexible display is disposed above the front member and outside of the electronic component holding chamber.

16. The flexible electronic device according to claim 10, wherein:
an electronic component of the flexible electronic device is disposed inside the electronic component holding chamber.

17. An apparatus, comprising:
a bendable front member; and
a bendable back member including a connection portion and a support portion, the connection portion having a higher degree of deformability relative to the support portion,
wherein:
the connection portion of the back member continues along a length direction of the back member and constitutes side edges of the back member, and each of the side edges of the back member constituted by the connection portion is attached to a corresponding one of side edges of the front member to form an electronic component holding chamber,
the support portion of the back member includes a plurality of members, the connection portion includes a plurality of deformable members, the plurality of deformable members of the connection portion and the plurality of members of the support portion are alternatively arranged along the length direction of the back member, and
in response to a bending force being exerted on the apparatus, one of the plurality of deformable members is deformed by the support portion to form a fold, ends of the one of the plurality of deformable members compressed by the support portion form starting points of the fold, and the one of the plurality of deformable members is pushed out between the starting points of the fold and protrudes outwards from the electronic component holding chamber.

* * * * *